(12) United States Patent
Li et al.

(10) Patent No.: US 10,907,952 B2
(45) Date of Patent: Feb. 2, 2021

(54) OPTICAL MEASUREMENT DEVICE AND METHOD WITH IMPROVED MEASUREMENT PRECISION

(71) Applicant: SHANGHAI MICRO ELECTRONICS EQUIPMENT (GROUP) CO., LTD., Shanghai (CN)

(72) Inventors: Yuzhi Li, Shanghai (CN); Bing Xu, Shanghai (CN); Zhiyong Yang, Shanghai (CN); Chang Zhou, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 22 days.

(21) Appl. No.: 16/338,636

(22) PCT Filed: Sep. 25, 2017

(86) PCT No.: PCT/CN2017/103232
§ 371 (c)(1),
(2) Date: Apr. 1, 2019

(87) PCT Pub. No.: WO2018/059358
PCT Pub. Date: Apr. 5, 2018

(65) Prior Publication Data
US 2019/0226831 A1 Jul. 25, 2019

(30) Foreign Application Priority Data

Sep. 30, 2016 (CN) .......................... 2016 1 0876766

(51) Int. Cl.
*G01B 11/00* (2006.01)
*G03F 7/20* (2006.01)
(Continued)

(52) U.S. Cl.
CPC ......... *G01B 11/002* (2013.01); *G01N 21/956* (2013.01); *G03F 7/70616* (2013.01);
(Continued)

(58) Field of Classification Search
CPC .. G03F 9/7011; G03F 9/7049; G03F 7/70633; G03F 7/70616; G03F 7/70775;
(Continued)

(56) References Cited

U.S. PATENT DOCUMENTS 5,440,394 A * 8/1995 Nose .................... G03F 7/70616
250/548
6,151,102 A * 11/2000 Nishi .................. G03F 7/70358
355/53

(Continued)

FOREIGN PATENT DOCUMENTS

CN          101067727 A     11/2007
CN          101356623 A      1/2009
(Continued)

*Primary Examiner* — Michael P LaPage
(74) *Attorney, Agent, or Firm* — Muncy, Geissler, Olds & Lowe, P.C.

(57) ABSTRACT

An optical measurement device and method are disclosed. A position measurement device is provided with a device for measuring inclinations of an optical detection module (5) and a substrate carrier (6) which are measured during movement of the optical detection unit and the substrate carrier. Calculation and correction can be made according to the inclination data and with reference to displacements of the optical detection module (5) and the substrate carrier (6) and coordinates of their positions. During measurement for a certain point on the substrate, measured data related to the point is corrected by using the device and the method, which improves measurement precision, thus eliminating a large error caused in measurement for a large-sized substrate (9).

20 Claims, 3 Drawing Sheets

(51) Int. Cl.
G01N 21/956 (2006.01)
H01L 21/68 (2006.01)

(52) U.S. Cl.
CPC ...... G03F 7/70633 (2013.01); G03F 7/70775 (2013.01); H01L 21/682 (2013.01)

(58) Field of Classification Search
CPC ....... G03F 9/00–9/7096; G01B 11/161; G01B 9/02; G01B 11/00; G01B 11/02; G01B 11/0616; G01B 11/002; G01N 21/956; H01L 21/682
See application file for complete search history.

(56) References Cited

U.S. PATENT DOCUMENTS

| | | | | |
|---|---|---|---|---|
| 2001/0055117 | A1* | 12/2001 | Mizutani | G03F 7/70691 356/401 |
| 2003/0142313 | A1 | 7/2003 | Katayama | |
| 2005/0151947 | A1* | 7/2005 | Fujimaki | G03F 7/70716 355/55 |
| 2008/0013089 | A1* | 1/2008 | Ishii | G03F 9/7011 356/400 |
| 2014/0168625 | A1 | 6/2014 | Ito | |
| 2014/0322833 | A1 | 10/2014 | Yamaguchi et al. | |

FOREIGN PATENT DOCUMENTS

| | | |
|---|---|---|
| CN | 101405837 A | 4/2009 |
| CN | 101510058 A | 8/2009 |
| CN | 101642744 A | 2/2010 |
| CN | 103988049 A | 8/2014 |
| CN | 104412062 A | 3/2015 |
| CN | 104848877 A | 8/2015 |
| CN | 105182693 A | 12/2015 |
| CN | 105182695 A | 12/2015 |
| CN | 105527795 A | 4/2016 |
| CN | 105627919 A | 6/2016 |
| CN | 105917441 A | 8/2016 |
| JP | H04344411 A | 12/1992 |
| JP | 2005300641 A | 10/2005 |
| JP | 2007305989 A | 11/2007 |

* cited by examiner

OPTICAL MEASUREMENT DEVICE AND METHOD WITH IMPROVED MEASUREMENT PRECISION

TECHNICAL FIELD

The present invention relates to the field of semiconductors, and in particular, to an optical measurement device and method.

BACKGROUND

During manufacturing of a semiconductor integrated circuit, a complete chip usually needs to be subjected to photolithography and exposure for many times before fabrication is completed. Photolithography is a process of forming a line on a photoresist-coated substrate by means of exposure and development. A process of performing a further photolithography on the substrate having being subjected to photolithography is called overlay. During photolithography, factors that affect photolithography accuracy mainly include: a positional deviation between the substrate and a mask, a line width of a line formed by photolithography, the thickness of the photoresist, and an overlay deviation.

Among commercially-available optical measurement apparatuses at present, there is one that integrates measurement of a film thickness, position, and overlay deviation. For example, Chinese patent publication No. CN104412062A (application No. CN201380035853.2, and publication date: Mar. 11, 2015) provides a film thickness measurement device, where a to-be-measured substrate is placed on a substrate carrier above which there is a gantry, and a film thickness measurer is mounted on a slider and moves on the gantry, to measure the thickness of a film on the substrate. The device also includes a position adjustment unit, which is a unit for measuring the position and an overlay deviation. Currently, the unit for measuring the position and the overlay deviation is a bridge-like or of a gantry structure. A measurement interferometer is disposed in each moving direction of the unit for measurement control, while no measurement interferometer is disposed in a non-moving direction. Position correction is implemented by using a large mask covering the whole measurement range.

To ensure measurement precision, the commercially-available standard deviation measurement apparatuses at present all use a large mask for periodical correction, which has the following shortcomings: First, maintenance is inconvenient. An apparatus manufacturer needs to carry out calibration and manually mount the mask. Secondly, as the substrate in a flat panel is increased in size, the corresponding mask also needs to be increased in size, resulting in limitations in use. Thirdly, the increase in size results in extension of the range of motion of the apparatus or an increase in the size of the apparatus, thus inevitably making the error more obvious, increasing the error value, and affecting the measurement.

SUMMARY OF THE INVENTION

The present invention provides an optical measurement device and method, which reckon an inclination of an instrument during measurement in an error, thus improving measurement precision and solving the foregoing problems.

To achieve the foregoing objective, the present invention provides an optical measurement device, which includes: a substrate carrier, configured to carry a substrate; an optical detection platform frame, configured to bear and support an optical detection slider above the substrate carrier, the optical detection slider being able to slide along the optical detection platform frame; an optical detection unit, located above the substrate carrier and attached to the optical detection slider, and able to move along the optical detection platform frame with the optical detection slider, the optical detection unit including a mark position measurement module; a substrate carrier position measurement module, configured to measure a position of the substrate carrier; an optical detection unit position measurement module, configured to measure a position of the optical detection unit; and a correction module, configured to obtain, based on the position of the substrate carrier and the position of the optical detection unit, deviations in measurement of mark positions induced by movements of the substrate carrier and the optical detection unit, and further configured to correct the mark positions measured by the mark position measurement module based on the deviations in measurement of the mark positions.

Preferably, the substrate carrier position measurement module includes a substrate carrier Y-direction measuring component and a substrate carrier X-direction measuring component; the substrate carrier Y-direction measuring component measures a displacement of the substrate carrier in the Y direction, and the substrate carrier X-direction measuring component measures an offset of the substrate carrier in the X direction during Y-direction movement of the substrate carrier.

Preferably, the optical detection unit position measurement module includes: an optical detection unit X-direction measuring component, an optical detection slider X-direction measuring component, and an optical detection unit Y-direction measuring component, wherein the optical detection unit X-direction measuring component is configured to measure a displacement of the optical detection unit in an X direction; the optical detection slider X-direction measuring component is configured to measure a displacement of the optical detection slider in the X direction; and the optical detection unit Y-direction measuring component is configured to measure an offset of the optical detection unit with respect to the optical detection platform frame in a Y direction during X-direction movement of the optical detection unit.

Preferably, the substrate carrier Y-direction measuring component and the substrate carrier X-direction measuring component are both interferometers.

Preferably, the optical detection unit X-direction measuring component and the optical detection slider X-direction measuring component are both interferometers, and the optical detection unit Y-direction measuring component is a laser displacement sensor.

Preferably, the optical detection unit further includes a height adjustment module for measuring and adjusting a distance from the optical detection unit to an upper surface of the substrate.

Preferably, a reference board having calibration marks is further provided on the substrate carrier, and the reference board is configured to correct the position of the substrate carrier and the position of the optical detection unit.

Preferably, the reference board with calibration marks includes a horizontal reference board and a vertical reference board perpendicular to the horizontal reference board; the horizontal reference board is arranged along an X direction of the substrate carrier and is used for calibrating a positional deviation of the substrate from the optical detection unit in a Y direction which occurs when the optical detection unit moves along the X direction; and the vertical reference board is arranged along the Y direction of the substrate carrier and is used for calibrating a positional deviation of the substrate from the optical detection unit in the X direction which occurs when the substrate carrier moves along the Y direction.

Preferably, the optical measurement device further includes a support base, for carrying the substrate carrier and the optical detection platform frame.

Preferably, the support base includes a vibration damper and a marble platform from bottom to top.

Preferably, the optical detection unit is further used for detecting a line width of a pattern formed on the substrate after exposure, an overlay deviation, a mark position deviation, and/or a photoresist thickness.

The present invention further provides an optical measurement method, where a direction in which an optical detection slider moves along an optical detection platform frame is defined as an X direction, a direction perpendicular to the X direction in a horizontal plane is defined as a Y direction, and a vertical direction is defined as a Z direction, to establish a three-dimensional coordinate system in the X, Y, Z directions; and the method includes the following steps:

providing a substrate having detection marks and placing the substrate on a substrate carrier;

controlling the substrate carrier to move along the Y direction, and controlling an optical detection unit to move along the X direction, such that a detection mark i is located below a mark position measurement module, wherein the mark position measurement module measures an alignment deviation (dxi_align, dyi_align) of the detection mark i from a center of the mark position measurement module;

measuring, by a substrate carrier Y-direction measuring component, a displacement Yi of the substrate carrier in the Y direction, a magnitude Rzy_wsi of rotation of the substrate carrier in a ZY plane, and an inclination Rx_wsi of the substrate about an X axis; and measuring, by a substrate carrier X-direction measuring component, an offset X_wsi of the substrate carrier in the X direction when the substrate carrier moves to a position Yi; and then calculating an alignment deviation (dxi_align1, dyi_align1) of the detection mark i from the center of the mark position measurement module, which alignment deviation (dxi_align1, dyi_align1) is induced when the substrate carrier moves to the position Yi, according to the offset X_wsi of the substrate carrier in the X direction when the substrate carrier moves to the position Yi, the magnitude Rzy_wsi of rotation of the substrate carrier in the ZY plane, and the inclination Rx_wsi of the substrate about the X axis;

measuring, by an optical detection unit X-direction measuring component, a displacement Xi of the optical detection unit in the X direction; measuring, by an optical detection slider X-direction measuring component, a displacement X'i of the optical detection slider in the X direction and a magnitude Rzx_omi of rotation of the optical detection slider in a ZX plane; measuring, by an optical detection unit Y-direction measuring component, an offset Y_omi of the optical detection unit with respect to the optical detection platform frame in the Y direction when the optical detection unit moves to a position Xi, and an inclination Rx_omi of the optical detection unit about the X axis; calculating an inclination Ry_omi of the optical detection unit about a Y axis when the optical detection unit moves to the position Xi according to the displacement Xi of the optical detection unit in the X direction and the displacement X'i of the optical detection slider in the X direction; and afterwards, calculating an alignment deviation (dxi_align2, dyi_align2) of the detection mark i from the center of the mark position measurement module, which alignment deviation (dxi_align2, dyi_align2) is induced when the optical detection unit moves to the position Xi, according to a magnitude Rzx_omi of rotation of the optical detection unit in the ZX plane when the optical detection unit moves to the position Xi and the inclination Ry_omi about the Y axis, and the offset Y_omi of the optical detection unit with respect to the optical detection platform frame in the Y direction and the inclination Rx_omi about the X axis; and correcting the alignment deviation (dxi_align, dyi_align) of the detection mark i from the center of the mark position measurement module according to the alignment deviation (dxi_align1, dyi_align1) of the detection mark i from the center of the mark position measurement module which is induced when the substrate carrier moves to the position Yi and the alignment deviation (dxi_align2, dyi_align2) of the detection mark i from the center of the mark position measurement module which is induced when the optical detection unit moves to the position Xi.

Preferably, the alignment deviation (dxi_align1, dyi_align1) of the detection mark i from the center of the mark position measurement module which is induced when the substrate carrier moves to the position Yi is calculated according to the following formula:

$$dxi\_align1 = X\_wsi + A\_ws \times Rzy\_wsi;$$

$$dyi\_align1 = B\_ws \times Rzy\_wsi + H\_ws \times Rx\_wsi;$$

wherein A_ws is a deviation of a center of a measurement spot from a rotation center of the substrate carrier in the Y direction, the measurement spot being projected by the substrate carrier X-direction measuring component onto the substrate carrier;

B_ws is a deviation of a center of a measurement spot from the rotation center of the substrate carrier in the X direction, the measurement spot being projected by the substrate carrier Y-direction measuring component onto the substrate carrier; and H_ws is a distance from a center of the measurement spot to an optimal focal plane of the mark position measurement module in the Z direction, the measurement spot being projected by the substrate carrier Y-direction measuring component onto the substrate carrier.

Preferably, the the alignment deviation (dxi_align2, dyi_align2) of the detection mark i from the center of the mark position measurement module which is induced when the optical detection unit moves to the position Xi is calculated according to the following formula:

$$dxi\_align2 = A\_om \times Rzx\_ + H\_om \times Ry\_omi;$$

$$dyi\_align2 = Y\_omi + B\_om \times Rzx\_omi + H'\_om \times Rx\_omi,$$

wherein A_om is a deviation of a center of a measurement spot from a rotation center of the optical detection unit in the Y direction, the measurement spot being projected by the optical detection unit X-direction measuring component onto the optical detection unit;

B_om is a deviation of a center of a measurement spot from the rotation center of the optical detection unit in the X direction, the measurement spot being projected by the optical detection unit Y-direction measuring component onto the optical detection unit;

H_om is a distance from the center of the measurement spot to the optimal focal plane of the mark position measurement module in the Z direction, the measurement spot being projected by the optical detection unit X-direction measuring component onto the optical detection unit; and H'_om is a distance from a center of a measurement spot to the optimal focal plane of the mark position measurement module in the Z direction, the measurement spot being projected by the optical detection slider X-direction measuring component onto the optical detection slider.

Preferably, the method further includes calibrating a position of the substrate carrier and a position of the optical detection unit, which specifically includes the following steps:

measuring calibration marks on a reference board on the substrate carrier, by: controlling the substrate carrier to move along the Y direction and the optical detection unit to move along the X direction, such that a calibration mark j on the reference board is located below the mark position measurement module; measuring, by the mark position measurement module, a position of the calibration mark j; and calculating an alignment deviation (dxj_align, dyj_align) of the calibration mark j from the center of the mark position measurement module;

measuring, by the substrate carrier Y-direction measuring component, a displacement Yj of the substrate carrier in the Y direction, a magnitude Rzy_wsj of rotation of the substrate carrier in the ZY plane, and an inclination Rx_wsj of the substrate carrier about the X axis; measuring, by the substrate carrier X-direction measuring component, an offset X_wsj of the substrate carrier in the X direction when the substrate carrier moves to a position Yj; and then, calculating an alignment deviation (dxj_align1, dyj_align1) of the calibration mark j from the center of the mark position measurement module, which alignment deviation (dxj_align1, dyj_align1) is induced when the substrate carrier moves to the position Yj, according to the offset X_wsj of the substrate carrier in the X direction when the substrate carrier moves to the position Yj, the magnitude Rzy_wsj of rotation of the substrate carrier in the ZY plane, and the inclination Rx_wsj of the substrate carrier about the X axis;

measuring, by the optical detection unit X-direction measuring component, a displacement Xj of the optical detection unit in the X direction; measuring, by the optical detection slider X-direction measuring component, a displacement X'j of the optical detection slider in the X direction and a magnitude Rzx_omj of rotation of the optical detection slider in the ZX plane; measuring, by the optical detection unit Y-direction measuring component, an offset Y_omj of the optical detection unit with respect to the optical detection platform frame in the Y direction when the optical detection unit moves to the position Xj, and an inclination Rx_omj of the optical detection unit about the X axis; calculating an inclination Ry_omj of the optical detection unit about the Y axis when the optical detection unit moves to the position Xj according to the displacement Xj of the optical detection unit in the X direction and the displacement X'j of the optical detection slider in the X direction; and afterwards, calculating an alignment deviation (dxj_align2, dyj_align2) of the calibration mark j from the center of the mark position measurement module, which alignment deviation (dxj_align2, dyj_align2) is induced when the optical detection unit moves to the position Xj, according to the magnitude Rzx_omj of rotation of the optical detection unit in the ZX plane and the inclination Ry_omj about the Y axis when the optical detection unit moves to the position Xj, the offset Y_omj of the optical detection unit with respect to the optical detection platform frame in the Y direction and the inclination Rx_omj about the X axis;

correcting the alignment deviation (dxj_align, dyj_align) of the calibration mark j from the center of the mark position measurement module according to the alignment deviation (dxj_align1, dyj_align1) of the calibration mark j from the center of the mark position measurement module which is induced when the substrate carrier moves to the position Yj and the alignment deviation (dxj_align2, dyj_align2) of the calibration mark j from the center of the mark position measurement module which is induced when the optical detection unit moves to the position Xj;

repeating the foregoing steps, to obtain corrected alignment deviations (dxj_align, dyj_align) of all the calibration marks from the center of the mark position measurement module, wherein j=1, 2, . . . n;

processing the corrected alignment deviations (dxj_align, dyj_align), j=1, 2, . . . n, of all the calibration marks from the center of the mark position measurement module, to obtain an alignment residual ΔXi between the reference board and the center of the mark position measurement module when the substrate carrier is at the position Yi and an alignment residual ΔYi between the reference board and the center of the mark position measurement module when the optical detection unit is at the position Xi; and finally, compensating the alignment deviation (dxi_align1, dyi_align1) of the detection mark i from the center of the mark position measurement module which is induced when the substrate carrier moves to the position Yi, with the alignment residual ΔXi between the reference board and the center of the mark position measurement module when the substrate carrier is at the position Yi; and compensating the alignment deviation (dxi_align2, dyi_align2) of the detection mark i from the center of the mark position measurement module which is induced when the optical detection unit moves to the position Xi, with the alignment residual ΔYi between the reference board and the center of the mark position measurement module when the optical detection unit is at the position Xi.

Preferably, the alignment deviation (dxi_align1, dyi_align1) of the detection mark i from the center of the mark position measurement module which is induced when the substrate carrier moves to the position Yi is compensated with the alignment residual ΔXi between the reference board and the center of the mark position measurement module when the substrate carrier is at the position Yi, according to the following formula:

$$dxi\_align1 = X\_wsi + A\_ws \times Rzy\_wsi + \Delta Xi;$$

$$dyi\_align1 = B\_ws \times Rzy\_wsi + H\_ws \times Rx\_wsi,$$

wherein A_ws is a deviation of a center of a measurement spot from a rotation center of the substrate carrier in the Y direction, the measurement spot being projected by the substrate carrier X-direction measuring component onto the substrate carrier;

B_ws is a deviation of a center of a measurement spot from the rotation center of the substrate carrier in the X direction, the measurement spot being projected by the substrate carrier Y-direction measuring component onto the substrate carrier; and H_ws is a distance from the center of the measurement spot to an optimal focal plane of the mark position measurement module in the Z direction, the measurement spot being projected by the substrate carrier Y-direction measuring component onto the substrate carrier.

Preferably, the alignment deviation (dxi_align2, dyi_align2) of the detection mark i from the center of the mark position measurement module which is induced when the optical detection unit moves to the position Xi is compensated with the alignment residual ΔYi between the reference board and the center of the mark position measurement module when the optical detection unit is at the position Xi, according to the following formula:

$$dxi\_align2 = A\_om \times Rzx\_omi + H\_om \times Ry\_omi;$$

$$dyi\_align2 = Y\_omi + B\_om \times Rzx\_omi + H'\_om \times Rx\_omi + \Delta Yi,$$

wherein A_om is a deviation of a center of a measurement spot from a rotation center of the optical detection unit in the Y direction, the measurement spot being projected by the optical detection unit X-direction measuring component onto the optical detection unit;

B_om is a deviation of a center of a measurement spot from the rotation center of the optical detection unit in the X direction, the measurement spot being projected by the optical detection unit Y-direction measuring component onto the optical detection unit;

H_om is a distance from the center of the measurement spot to the optimal focal plane of the mark position measurement module in the Z direction, the measurement spot being projected by the optical detection unit X-direction measuring component onto the optical detection unit; and H'_om is a distance from a center of a measurement spot to the optimal focal plane of the mark position measurement module in the Z direction, the measurement spot being projected by the optical detection slider X-direction measuring component onto the optical detection slider.

Preferably, a Y-direction reference board parallel with the Y direction is arranged on the substrate carrier, and is used for measuring an alignment residual ΔXi between the Y-direction reference board and the center of the mark position measurement module when the substrate carrier is at the position Yi; and an X-direction reference board parallel with the X direction is arranged on the substrate carrier, and is used for measuring an alignment residual ΔYi between the X-direction reference board and the center of the mark position measurement module when the optical detection unit is at the position Xi.

Preferably, the corrected alignment deviations (dxj_align, dyj_align) of all the reference marks from the center of the mark position measurement module are processed by using a linear interpolation method, wherein j=1, 2, ... n, to obtain the alignment residual ΔXi between the reference board and the center of the mark position measurement module when the substrate carrier is at the position Yi and the alignment residual ΔYi between the reference board and the center of the mark position measurement module when the optical detection unit is at the position Xi.

Preferably, detecting a detection mark by the mark position measurement module further includes: measuring a current height value Z1 from the mark position measurement module to the detection mark;

calculating a height difference dZ between the height value Z1 and a height value Z2 of an optimal focal plane of the mark position measurement module as dZ=Z1−Z2; and controlling the mark position measurement module to vertically move by a distance of dZ, such that the detection mark is located on the optimal focal plane of the mark position measurement module.

Compared with the prior art, the present invention achieves the following advantageous effects:

The present invention provides an optical measurement device and method. A device for measuring inclinations of an optical detection unit and a substrate carrier which are measured during movement of the optical detection unit and the substrate carrier is disposed. Calculation and correction can be made according to the inclination data and with reference to displacements of an optical detection module and the substrate carrier and coordinates of their positions. During measurement for a certain point on the substrate, measured data related to the point is corrected by using the device and the method, which improves measurement precision of the mark positions, thus eliminating a large error caused in measurement for a large-sized substrate. Moreover, a reference board in a scanning direction and a reference board in a non-scanning direction are disposed on the substrate provided by the present invention, which facilitates automatic calibration by the apparatus and improves the convenience.

DESCRIPTION OF NUMERALS IN THE DRAWINGS

1—Support base; 2—Optical detection platform frame; 21, 22—Frame Y-direction interferometer measurement systems; 3—Optical detection slider; 4—Vertical motion mechanism control unit; 5—Optical detection module; 51—Module X-direction interferometer control and measurement system; 52—Slider X-direction interferometer control and measurement system; 53—Module Y-direction interferometer control and measurement system; 5a—Rough position measurement sensor; 5b—First sensor for precise position and line width measurement; 5c—Second sensor for precise position and line width measurement; 5d—Photoresist thickness measurement sensor; 5e—First height measurement sensor; 5f—Second height measurement sensor; 6—Substrate carrier; 61—X-direction interferometer control and measurement system for the substrate carrier; 62—Y-direction interferometer control and measurement system for the substrate carrier; 7—Reference board; 71—Line width calibration reference board; 72—X-direction reference board; 73—Y-direction reference board; 74—Photoresist thickness calibration reference board; 8—Substrate temperature control unit; 9—Substrate; 91—Substrate mark; L1 to L30—Mark point connecting lines.

DETAILED DESCRIPTION

To make the objective, features, and advantages of the present invention clearer, specific embodiments of the present invention are described in detail below with reference to the accompanying drawings.

Embodiment 1

Figure 1:
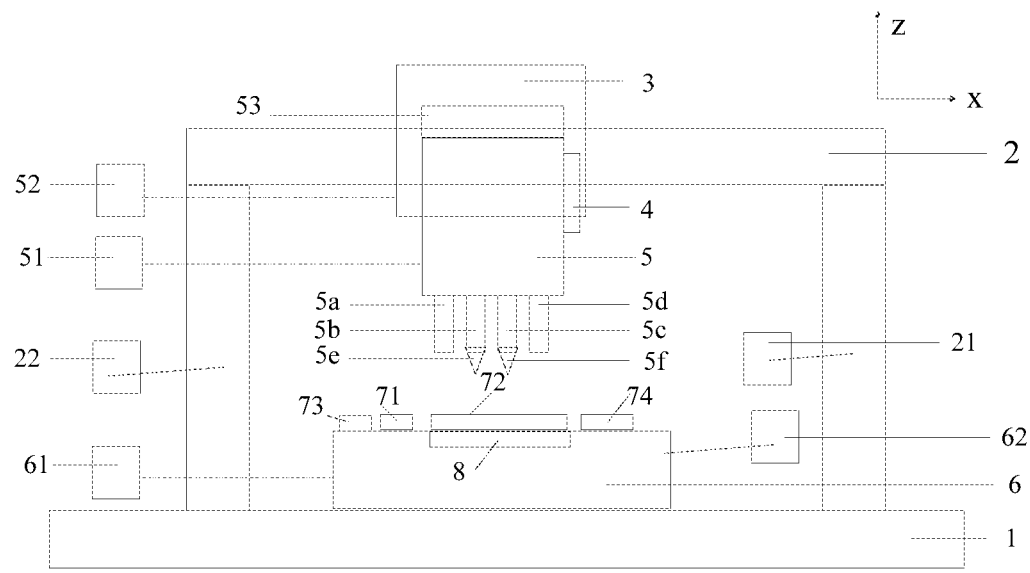
FIG. 1 is a schematic structural diagram of an optical measurement device provided by the present invention.
Figure 2:
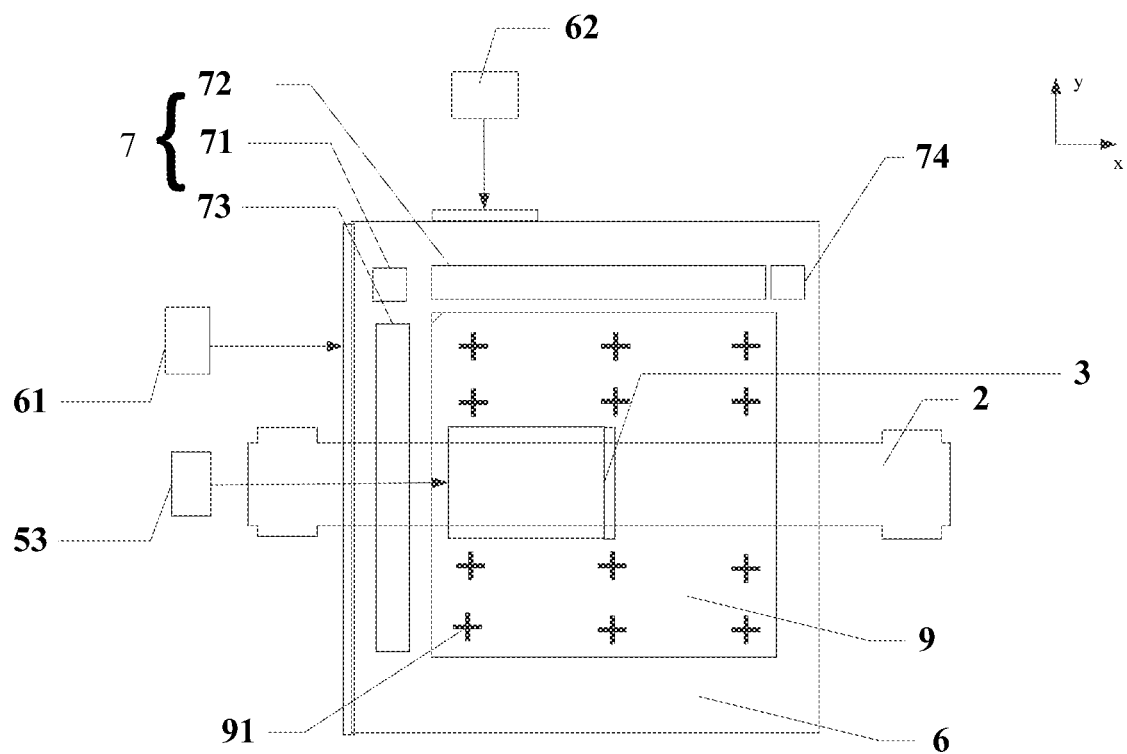
FIG. 2 is a top view of FIG. 1.
Figure 3:
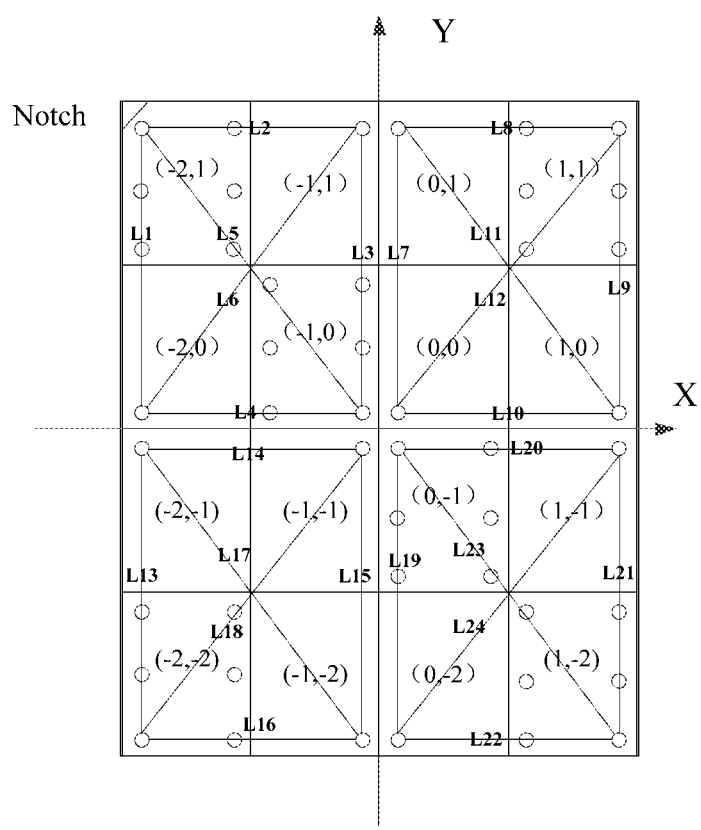
FIG. 3 and FIG. 4 are schematic diagrams showing distribution of mark points for deviation measurement on a substrate provided by the present invention.
Figure 4:
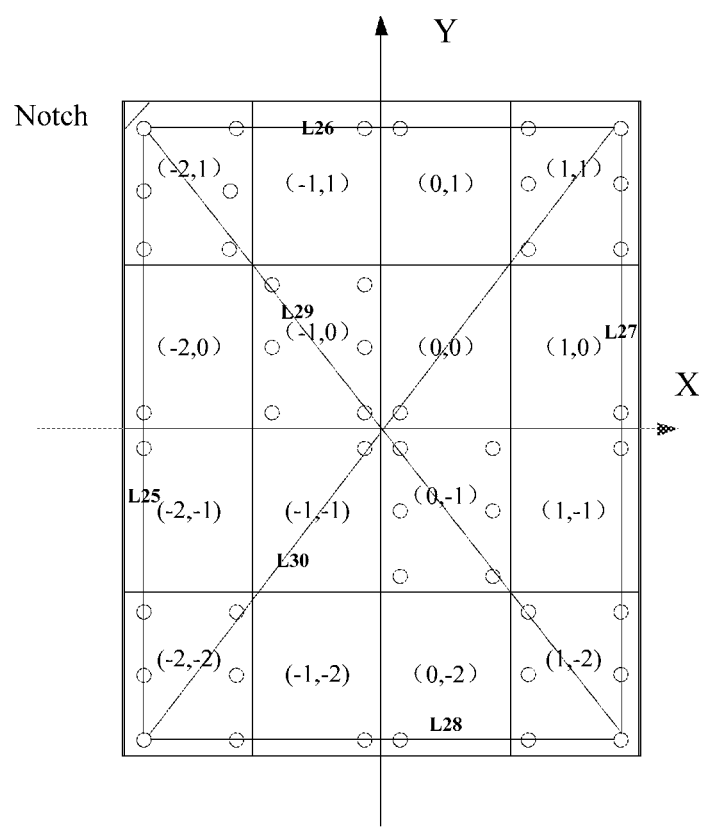

Referring to FIG. 1 and FIG. 2, a horizontally rightward direction is defined as an X direction, a direction perpendicular to the X direction in the horizontal plane is defined as a Y direction, and a vertically upward direction is defined as a Z direction, to establish a three-dimensional coordinate system in X, Y, Z directions. The measurement device that is able to be calibrated according to the present invention includes a support base 1 for bearing the whole measurement device that is able to be calibrated. The support base is formed by the following parts from bottom to top: a foundation in contact with the ground, a vibration damper for mitigating an effect of ground vibration on measurement carried out by the device, and a marble platform on which X-direction and Y-direction drive mechanisms can be disposed.

Referring to FIG. 2, the support base 1 is a square platform, and a substrate carrier 6 is placed at the center of the support base. The substrate carrier 6 is mainly used to carry a substrate 9, and various kinds of reference boards 7 for calibration of the substrate 9 are placed around the substrate 9. The reference boards 7 include an X-direction reference board 72, namely, a horizontal reference board, for calibrating the substrate 9 in the X direction; a Y-direction reference board 73, namely, a vertical reference board, for calibrating the substrate 9 in the Y direction; a line width calibration reference board 71; and a photoresist thickness calibration reference board 74 for calibrating the thickness of photoresist. The X-direction reference board 72 and the Y-direction reference board 73 are perpendicular to each other. The line width calibration reference board 71 and the photoresist thickness calibration reference board 74 are located at two ends of the X-direction reference board 72, respectively.

Periodically distributed calibration marks are designed and provided on both the X-direction reference board 72 and the Y-direction reference board 73, and are used to correct a positional deviation. The line width calibration reference board 71 is used to calibrate a deviation of a line width measured by using a first sensor 5b for precise position and line width measurement with respect to a line width measured by using a second sensor 5c for precise position and line width measurement, to ensure measurement accuracy of the line width.

Above the support base 1, an optical detection platform frame 2 is disposed above the substrate carrier 6. The optical detection platform frame 2 is a gantry, which extends upwards from one side of the substrate carrier 6 along the Z direction to a certain height, extends along the X direction to the opposite side of the substrate carrier 6, and then extends downwards along the Z direction to the support base 1.

An optical detection slider 3 which can move along the optical detection platform frame 2 is disposed on the optical detection platform frame 2. That is to say, the optical detection slider 3 is mounted on the optical detection platform frame 2 and can move along the X direction. An optical detection unit, namely, an optical detection module 5, is fixed below the optical detection slider 3. The optical detection module 5 includes parameter detection and mark position measurement modules, which are specifically: a mark position measurement module, a line width measurement module, and a photoresist thickness measurement module disposed beneath the optical detection module 5. The foregoing three measurement modules are integrated in one optical detection module 5. When the optical detection module 5 is driven by the optical detection slider 3 to move along the X direction, any combination of the foregoing three measurement modules can be selected for measurement, or the three measurement modules can be separately used for measurement. During measurement of data regarding the substrate 9, the foregoing three measurement modules simultaneously correspond to the same position, thus facilitating analysis, and especially facilitating analysis of a correlation between the line width of a line and the photoresist thickness.

A height adjustment module is disposed on the optical detection module 5, and is mounted on a vertical motion mechanism control unit 4 at one side of the optical detection module 5. The height adjustment module can control Z-direction motion of the optical detection module 5 with respect to the optical detection slider 3, thus adjusting the height of the optical detection module 5 with respect to the substrate 9.

Specifically, continuously referring to FIG. 1, the parameter detection and mark position measurement modules on the lower surface of the optical detection module 5 are set as follows:

a rough position measurement sensor 5a, used for measuring a deviation of the substrate 9 from the substrate carrier 6, so as to ensure that substrate marks 91 on the substrate 9 fall within fields of view defined by the first sensor 5b for precise position and line width measurement and the second sensor 5c for precise position and line width measurement;

the first sensor 5b for precise position and line width measurement, used for measuring deviations of the substrate marks 91, a line width up to the critical dimension of a photoresist line, and overlay deviations;

the second sensor 5c for precise position and line width measurement, used for measuring positional deviations of the substrate marks 91, a line width up to the critical dimension of the photoresist line, and overlay deviations. The second sensor 5c for precise position and line width measurement and the first sensor 5b for precise position and line width measurement are symmetrically arranged. The second sensor 5c for precise position and line width measurement has a smaller field of view compared to the first sensor 5b for precise position and line width measurement, such that a line width up to the critical dimension of a finer photoresist line can be measured;

a photoresist thickness measurement sensor 5d, used for measuring the thickness of photoresist on the substrate 9, or on the reference board 7, or on a silicon wafer, where this sensor and the rough position measurement sensor 5a are symmetrically arranged; and a first height measurement sensor 5e and a second height measurement sensor 5f, both used for measuring the height of the upper surface of the substrate 9, and symmetrically disposed on the first sensor 5b for precise position and line width measurement and the second sensor 5c for precise position and line width measurement respectively at the ends near the substrate 9.

The optical measurement device also includes: a substrate carrier position measurement module for measuring the position of the substrate carrier 6. The substrate carrier position measurement module includes: a substrate carrier Y-direction measuring component and a substrate carrier X-direction measuring component. The substrate carrier Y-direction measuring component measures a displacement of the substrate carrier in the Y direction, and the substrate carrier X-direction measuring component measures an offset of the substrate carrier in the X direction during Y-direction motion of the substrate carrier. The two measuring components are specifically as follows:

an X-direction interferometer control and measurement system 61 for the substrate carrier, namely, the substrate carrier X-direction measuring component, used for controlling motion of the substrate carrier 6 in the X direction, and measuring the position X_ws of the substrate carrier 6 in the X direction and magnitude Rzx_ws of rotation of the substrate carrier 6 in an XZ plane; and a Y-direction interferometer control and measurement system 62 for the substrate carrier, namely, the substrate carrier Y-direction measuring component, used for controlling motion of the substrate carrier 6 in the Y direction; and measuring the position Y_ws of the substrate carrier 6 in the Y direction, magnitude Rzy_ws of rotation of the substrate carrier 6 in a ZY plane and an inclination Rx_ws thereof about the X axis.

The X-direction interferometer control and measurement system 61 for the substrate carrier and the Y-direction interferometer control and measurement system 62 for the substrate carrier are respectively disposed on the X direction and the Y direction with respect to the substrate carrier 6. They are both interferometers.

The optical measurement device further includes an optical detection unit position measurement module for measuring the position and a positional deviation of the optical detection module 5. The optical detection unit position measurement module includes: an optical detection unit X-direction measuring component, an optical detection slider X-direction measuring component, and an optical detection unit Y-direction measuring component, which are specifically as follows:

a module X-direction interferometer control and measurement system 51, namely, the optical detection unit X-direction measuring component, disposed on the optical detection module 5, and used for measuring a displacement X_om of the optical detection module 5 in the X direction and controlling motion of the optical detection module 5 in the X direction, where the module X-direction interferometer control and measurement system 51 and a slider X-direction interferometer control and measurement system 52 are connected to each other, and by parameter processing on data measured by the two systems, an inclination Ry_om of the optical detection module 5 can be obtained;

the slider X-direction interferometer control and measurement system 52, namely, the optical detection slider X-direction measuring component, disposed on the optical detection slider 3, and used for measuring magnitude Rzx_om of rotation of the optical detection module 5 in the XZ plane; and a module Y-direction interferometer control and measurement system 53, namely, the optical detection unit Y-direction measuring component, disposed on the optical detection module 5, and used for measuring a displacement Y_om of the optical detection module 5 with respect to the optical detection platform frame 2 and an inclination Rx_om thereof, where the optical detection unit X-direction measuring component and the optical detection slider X-direction measuring component are both interferometers, and the optical detection unit Y-direction measuring component is a laser displacement sensor.

In the present invention, a substrate temperature control unit 8 is further provided on the substrate carrier 6, which is a constant temperature system and disposed beneath the substrate 9. When the substrate 9 is mounted on the substrate carrier 6, the substrate temperature control unit can make the substrate 9 reach a target temperature rapidly, thus shortening the waiting time of the substrate 9 to reach the target temperature before a test, and improving production efficiency.

Moreover, in the measurement device that is able to be calibrated according to the present invention, the data detection modules or units or systems in the above description are all connected to a parameter processing unit in a control system. The parameter processing unit processes the detected data, and feeds back results to corresponding position control systems after completion of the processing. For example, the parameter processing unit feeds back the results to the vertical motion mechanism control unit 4, the module X-direction interferometer control and measurement system 51, the slider X-direction interferometer control and measurement system 52, the module Y-direction interferometer control and measurement system 53, the X-direction interferometer control and measurement system 61 for the substrate carrier, and the Y-direction interferometer control and measurement system 62 for the substrate carrier, to control respectively corresponding parts to make corresponding movement.

In the present invention, a correction module (i.e., a processor) is further disposed. Deviations in measurement of positions of the substrate marks 91 caused by motion of the substrate carrier 6 and the optical detection unit are obtained according to the position of the substrate carrier 6 and the position of the optical detection unit, and then positions of the substrate marks 91 measured by the mark position measurement module are corrected.

In the present invention, since the optical detection platform frame 2 deforms during operation, the optical detection slider 3 is likely to have a movement deviation in both of the Y and Z directions during movement. To avoid occurrence of this situation and compensate for these movement deviations, the position measurement device also includes a frame measurement unit located on the optical detection platform frame 2 and used for measuring magnitude of deformation of the optical detection platform frame. The frame measurement unit specifically includes frame Y-direction interferometer measurement systems 21 and 22 symmetrical about the substrate carrier 6. When the substrate carrier 6 moves along the Y direction, the frame Y-direction interferometer measurement systems 21 and 22 can measure magnitude Yref of deformation of the optical detection platform frame 2 and magnitude Rzref of rotational deformation thereof. The X-direction interferometer control and measurement system 61 for the substrate carrier and the Y-direction interferometer control and measurement system 62 for the substrate carrier correct and align the position of the substrate carrier 6 according to the measured data, to implement the correction function.

The present invention further provides a measurement method using the foregoing measurement device that is able to be calibrated. When the optical detection module 5 on the optical detection platform frame 2 moves to a position corresponding to a point on the substrate 9, positions and positional deviations of the substrate 9, the substrate carrier 6, the optical detection slider 3, and the optical detection module 5 and an inclination of the optical detection module 5 during movement are measured by using a position measurement device. Displayed data about the point is corrected according to the inclination. The method specifically includes the following steps:

A substrate 9 having substrate marks 91 is provided, and is placed on the substrate carrier 6.

The substrate carrier 6 is controlled to move along the Y direction, and the optical detection unit, namely, the optical detection module 5 is controlled to move along the X direction, such that any detection mark i is located below the mark position measurement module. The mark position measurement module measures the position of the detection mark i, and calculates an alignment deviation (dxi_align, dyi_align) of the detection mark i from the center of the mark position measurement module.

The substrate carrier Y-direction measuring component, namely, the Y-direction interferometer control and measurement system 62 for the substrate carrier, measures a displacement Yi of the substrate carrier 6 in the Y direction, magnitude Rzy_wsi of rotation of the substrate carrier in the ZY plane, and an inclination Rx_wsi thereof about the X axis. The substrate carrier X-direction measuring component, namely, the X-direction interferometer control and measurement system 61 for the substrate carrier, measures an offset X_wsi of the substrate carrier 6 in the X direction when the substrate carrier 6 moves to the position Yi; and then calculates an alignment deviation (dxi_align1, dyi_align1) of the detection mark i from the center of the mark position measurement module which occurs when the substrate carrier 6 moves to the position Yi, according to the offset X_wsi of the substrate carrier 6 in the X direction when the substrate carrier 6 moves to the position Yi, the magnitude Rzy_wsi of rotation of the substrate carrier in the ZY plane, and the inclination Rx_wsi thereof about the X axis.

The optical detection unit X-direction measuring component, namely, the module X-direction interferometer control and measurement system 51, measures a displacement Xi of the optical detection unit in the X direction. The optical detection slider X-direction measuring component, namely, the slider X-direction interferometer control and measurement system 52, measures a displacement X'i of the optical detection slider in the X direction and a magnitude Rzx_omi of rotation of the optical detection slider in a ZX plane. The optical detection unit Y-direction measuring component, namely, the module Y-direction interferometer control and measurement system 53, measures an offset Y_omi of the optical detection unit with respect to the optical detection platform frame 2 in the Y direction when the optical detection unit, namely, the optical detection module 5, moves to the position Xi, and an inclination Rx_omi thereof about the X axis. An inclination Ry_omi of the optical detection unit about the Y axis when the optical detection unit moves to the position Xi is calculated according to the displacement Xi of the optical detection unit in the X direction and the displacement X'i of the optical detection slider in the X direction. Afterwards, an alignment deviation (dxi_align2, dyi_align2) of the detection mark i from the center of the mark position measurement module which occurs when the optical detection unit moves to the position Xi is calculated according to a magnitude Rzx_omi of rotation of the optical detection unit in the ZX plane when the optical detection unit moves to the position Xi and the inclination Ry_omi about the Y axis, and the offset Y_omi of the optical detection unit with respect to the optical detection platform frame 2 in the Y direction and the inclination Rx_omi about the X axis.

The alignment deviation (dxi_align, dyi_align) of the detection mark i from the center of the mark position measurement module is corrected according to the alignment deviation (dxi_align1, dyi_align1) of the detection mark i from the center of the mark position measurement module which occurs when the substrate carrier 6 moves to the position Yi and the alignment deviation (dxi_align2, dyi_align2) of the detection mark i from the center of the mark position measurement module which occurs when the optical detection unit moves to the position Xi.

The step of calculating the alignment deviation (dxi_align1, dyi_align1) of the detection mark i from the center of the mark position measurement module which occurs when the substrate carrier 6 moves to the position Yi is specifically as follows:

$$dxi\_align1 = X\_wsi + A\_ws \times Rzy\_wsi;$$

$$dyi\_align1 = B\_ws \times Rzy\_wsi + H\_ws \times Rx\_wsi,$$

where A_ws is a deviation of the center of a measurement spot from a rotation center of the substrate carrier in the Y direction, the measurement spot being projected by the substrate carrier X-direction measuring component, namely, the X-direction interferometer control and measurement system 61 for the substrate carrier, onto the substrate carrier 6;

B_ws is a deviation of the center of a measurement spot from the rotation center of the substrate carrier 6 in the X direction, the measurement spot being projected by the Y-direction interferometer control and measurement system 62 for the substrate carrier onto the substrate carrier 6; and H_ws is a distance from the center of the measurement spot to an optimal focal plane of the mark position measurement module in the Z direction, the measurement spot being projected by the substrate carrier Y-direction measuring component, namely the Y-direction interferometer control and measurement system 62 for the substrate carrier, onto the substrate carrier 6.

The step of calculating the alignment deviation (dxi_align2, dyi_align2) of the detection mark i from the center of the mark position measurement module which occurs when the optical detection unit moves to the position Xi is specifically as follows:

$$dxi\_align2 = A\_om \times Rzx\_omi + H\_om \times Ry\_omi;$$

$$dyi\_align2 = Y\_omi + B\_om \times Rzx\_omi + H'\_om \times Rx\_omi,$$

where A_om is a deviation of the center of a measurement spot from a rotation center of the optical detection unit in the Y direction, the measurement spot being projected by the optical detection unit X-direction measuring component, namely, the module X-direction interferometer control and measurement system 51, onto the optical detection unit;

B_om is a deviation of the center of a measurement spot from the rotation center of the optical detection unit in the X direction, the measurement spot being projected by the optical detection unit Y-direction measuring component, namely, the module Y-direction interferometer control and measurement system 53, onto the optical detection unit;

H_om is a distance from the center of the measurement spot to the optimal focal plane of the mark position measurement module in the Z direction, the measurement spot being projected by the optical detection unit X-direction measuring component, namely, the module X-direction interferometer control and measurement system 51, onto the optical detection unit; and H'om is a distance from the center of a measurement spot to the optimal focal plane of the mark position measurement module in the Z direction, the measurement spot being projected by the optical detection slider X-direction measuring component, namely, the slider X-direction interferometer control and measurement system 52, onto the optical detection slider 3.

Preferably, the measurement method further includes calibration of the position of the substrate carrier and the position of the optical detection unit, which specifically includes the following steps:

Calibration marks on the reference board 7 on the substrate carrier are measured. First, the substrate carrier 6 is controlled to move along the Y direction, and the optical detection unit is controlled to move along the X direction, such that any calibration mark j on the reference board 7 is located below the mark position measurement module. The mark position measurement module measures the position of the calibration mark j, and then calculates an alignment deviation (dxj_align, dyj_align) of the calibration mark j from the center of the mark position measurement module.

The Y-direction interferometer control and measurement system 62 for the substrate carrier measures a displacement Yj of the substrate carrier 6 in the Y direction, magnitude Rzy_wsj of rotation thereof in the ZY plane, and an inclination Rx_wsj thereof about the X axis. The X-direction interferometer control and measurement system 61 for the substrate carrier measures an offset X_wsj of the substrate carrier in the X direction when the substrate carrier 6 moves to the position Yj; and then, calculates an alignment deviation (dxj_align1, dyj_align1) of the calibration mark j from the center of the mark position measurement module which occurs when the substrate carrier 6 moves to the position Yj, according to the offset X_wsj of the substrate carrier 6 in the X direction when the substrate carrier 6 moves to the position Yj, the magnitude Rzy_wsj of rotation thereof in the ZY plane, and the inclination Rx_wsj thereof about the X axis.

The module X-direction interferometer control and measurement system 51 measures a displacement Xj of the optical detection unit in the X direction. The slider X-direction interferometer control and measurement system 52 measures a displacement X'j of the optical detection slider 3 in the X direction and magnitude Rzx_omj of rotation thereof in the ZX plane. The module Y-direction interferometer control and measurement system 53 measures an offset Y_omj of the optical detection unit with respect to the optical detection platform frame 2 in the Y direction when the optical detection unit moves to the position Xj, and an inclination Rx_omj thereof about the X axis. An inclination Ry_omj of the optical detection unit about the Y axis when the optical detection unit moves to the position Xj is calculated according to the displacement Xj of the optical detection unit in the X direction and the displacement X'j of the optical detection slider 3 in the X direction. Afterwards, an alignment deviation (dxj_align2, dyj_align2) of the calibration mark j from the center of the mark position measurement module which occurs when the optical detection unit moves to the position Xj is calculated according to the magnitude Rzx_omj of rotation of the optical detection unit in the ZX plane when the optical detection unit moves to the position Xj and the inclination Ry_omj about the Y axis, and the offset Y_omj of the optical detection unit with respect to the optical detection platform frame 2 in the Y direction and the inclination Rx_omj about the X axis.

The alignment deviation (dxj_align, dyj_align) of the calibration mark j from the center of the mark position measurement module is corrected according to the alignment deviation (dxj_align1, dyj_align1) of the calibration mark j from the center of the mark position measurement module which occurs when the substrate carrier 6 moves to the position Yj and the alignment deviation (dxj_align2, dyj_align2) of the calibration mark j from the center of the mark position measurement module which occurs when the optical detection unit moves to the position Xj.

The foregoing steps are repeated, to obtain all corrected alignment deviations (dxj_align, dyj_align) of the calibration marks from the center of the mark position measurement module, where j=1, 2, . . . n.

All the corrected alignment deviations (dxj_align, dyj_align), j=1, 2, . . . n, of the calibration marks from the center of the mark position measurement module are processed, to obtain an alignment residual $\Delta$Xi between the reference board 7 and the center of the mark position measurement module when the substrate carrier 6 is at the position Yi and an alignment residual $\Delta$Yi between the reference board 7 and the center of the mark position measurement module when the optical detection unit is at the position Xi.

Finally, the alignment deviation (dxi_align1, dyi_align1) of the detection mark i from the center of the mark position measurement module which occurs when the substrate carrier 6 moves to the position Yi is compensated with the alignment residual $\Delta$Xi between the substrate 9 and the center of the mark position measurement module when the substrate carrier 6 is at the position Yi; and the alignment deviation (dxi_align2, dyi_align2) of the detection mark i from the center of the mark position measurement module which occurs when the optical detection unit moves to the position Xi is compensated with the alignment residual $\Delta$Yi between the substrate 9 and the center of the mark position measurement module when the optical detection unit is at the position Xi.

The step of compensating the alignment deviation (dxi_align1, dyi_align1) of the detection mark i from the center of the mark position measurement module which occurs when the substrate carrier 6 moves to the position Yi with the alignment residual $\Delta$Xi between the substrate 9 and the center of the mark position measurement module when the substrate carrier 6 is at the position Yi is specifically as follows:

$$dxi\_align1 = X\_wsi + A\_ws \times Rzy\_wsi + \Delta Xi;$$

$$dyi\_align1 = B\_ws \times Rzy\_wsi + H\_ws \times Rx\_wsi,$$

where A_ws is a deviation of the center of a measurement spot from a rotation center of the substrate carrier 6 in the Y direction, the measurement spot being projected by the X-direction interferometer control and measurement system 61 for the substrate carrier onto the substrate carrier 6;

B_ws is a deviation of the center of a measurement spot from the rotation center of the substrate carrier 6 in the X direction, the measurement spot being projected by the Y-direction interferometer control and measurement system 62 for the substrate carrier onto the substrate carrier 6; and H_ws is a distance from the center of the measurement spot to an optimal focal plane of the mark position measurement module in the Z direction, the measurement spot being projected by the Y-direction interferometer control and measurement system 62 for the substrate carrier onto the substrate carrier 6.

The step of compensating the alignment deviation (dxi_align2, dyi_align2) of the detection mark i from the center of the mark position measurement module which occurs when the optical detection unit moves to the position Xi with the alignment residual $\Delta$Yi between the substrate and the center of the mark position measurement module when the optical detection unit is at the position Xi is specifically as follows:

$$dxi\_align2 = A\_omi \times Rzx\_omi + H\_omi \times Ry\_omi;$$

$$dyi\_align2 = Y\_omi + B\_om \times Rzx\_omi + H'\_om \times Rx\_omi + \Delta Yi,$$

where A_om is a deviation of the center of a measurement spot from a rotation center of the optical detection unit in the Y direction, the measurement spot being projected by the module X-direction interferometer control and measurement system 51 onto the optical detection unit;

B_om is a deviation of the center of a measurement spot from the rotation center of the optical detection unit in the X direction, the measurement spot being projected by the module Y-direction interferometer control and measurement system 53 onto the optical detection unit;

H_om is a distance from the center of the measurement spot to the optimal focal plane of the mark position measurement module in the Z direction, the measurement spot being projected by the module X-direction interferometer control and measurement system 51 onto the optical detection unit; and H'_om is a distance from the center of a measurement spot to the optimal focal plane of the mark position measurement module in the Z direction, the measurement spot being projected by the slider X-direction interferometer control and measurement system 52 onto the optical detection slider 3.

Preferably, the Y-direction reference board 73 is used for measuring an alignment residual ΔXi between the Y-direction reference board 73 and the center of the mark position measurement module when the substrate carrier 6 is at the position Yi. The X-direction reference board 72 is used for measuring an alignment residual ΔYi between the X-direction reference board 72 and the center of the mark position measurement module when the optical detection unit is at the position Xi.

Preferably, all the corrected alignment deviations (dxj_align, dyj_align) of the reference marks from the center of the mark position measurement module are processed by using a linear interpolation method, where j=1, 2, . . . n, to obtain an alignment residual ΔXi between the reference board 7 and the center of the mark position measurement module when the substrate carrier 6 is at the position Yi and an alignment residual ΔYi between the reference board 7 and the center of the mark position measurement module when the optical detection unit is at the position Xi.

Preferably, the step of detecting a mark by the mark position measurement module further includes: measuring a height value Z1 from the mark position measurement module to the mark in this case;

calculating a height difference between the height value Z1 and a height value Z2 of the optimal focal plane of the mark position measurement module: dZ=Z1−Z2; and controlling the mark position measurement module to vertically move by a distance of dZ, such that the mark is located on the optimal focal plane of the mark position measurement module. Preferably, Table 1 is formed according to the foregoing steps:

TABLE 1

Data about positions and deviations of detection marks on the substrate

| Mark Position X(mm) | Mark Position Y(mm) | Result X(μm) | Result Y(μm) | delta X(μm) | delta Y(μm) |
|---|---|---|---|---|---|
| −350 | 441 | 349998.6756 | 441001.0291 | 1324.402 | 1029.102 |
| −190 | 441 | 189998.0501 | 441000.6675 | 1949.881 | 667.487 |
| −350 | 345 | 349998.9681 | 345000.8473 | 1031.934 | 847.29 |
| −190 | 345 | 189998.2982 | 345000.6595 | 1701.779 | 659.453 |
| −350 | 249 | 349999.2224 | 249000.8953 | 777.588 | 895.325 |
| −190 | 249 | 189998.7274 | 249000.7549 | 1272.645 | 754.92 |
| −10 | 441 | 9998.2001 | 440999.9123 | 1799.9 | −87.674 |
| 10 | 441 | −10001.744 | 440999.8857 | 1744.043 | −114.302 |
| 190 | 441 | −190001.775 | 440999.2934 | 1774.892 | −706.574 |
| 350 | 441 | −350001.852 | 440999.0385 | 1851.997 | −961.541 |
| 190 | 345 | −190001.764 | 344999.0577 | 1763.8 | −942.256 |
| 350 | 345 | −350002.056 | 344998.7796 | 2055.831 | −1220.381 |
| 190 | 249 | −190001.566 | 248999.0075 | 1565.564 | −992.501 |
| 350 | 249 | −350001.742 | 248998.7478 | 1741.528 | −1252.2 |
| −350 | 19 | 350000.0368 | 19000.98272 | −36.838 | 982.723 |
| −170 | 211 | 169999.0075 | 211000.6389 | 992.532 | 638.893 |
| −10 | 211 | 9998.831051 | 210999.9461 | 1168.949 | −53.919 |
| −170 | 115 | 169999.3056 | 115000.3975 | 694.418 | 397.466 |
| −10 | 115 | 9999.073513 | 114999.923 | 926.487 | −76.987 |
| −170 | 19 | 169999.5353 | 19000.36251 | 464.724 | 362.511 |
| −10 | 19 | 9999.36259 | 19000.22955 | 637.41 | 229.554 |
| 10 | 19 | −10000.648 | 18999.95753 | 648.01 | −42.474 |
| 350 | 19 | −350001.241 | 18998.59591 | 1241.397 | −1404.088 |
| −350 | −19 | 350000.1845 | −18999.00534 | −184.473 | 994.656 |
| −10 | −19 | 9999.39676 | −18999.94769 | 603.24 | 52.307 |
| 10 | −19 | −10000.5523 | −18999.9289 | 552.343 | 71.099 |
| 170 | −19 | −170000.845 | −19001.23925 | 844.557 | −1239.251 |
| 10 | −115 | −10000.2118 | −114999.9002 | 211.805 | 99.768 |
| 170 | −115 | −170000.607 | −115001.1953 | 606.701 | −1195.257 |
| 10 | −211 | −9999.91264 | −210999.5573 | −87.359 | 442.727 |
| 170 | −211 | −170000.238 | −211000.924 | 238.225 | −924.037 |
| 350 | −19 | −350001.096 | −19001.59111 | 1096.141 | −1591.113 |
| −350 | −249 | 350001.0159 | −248999.2212 | −1015.885 | 778.804 |
| −190 | −249 | 190000.4948 | −248999.4983 | −494.766 | 501.703 |
| −350 | −345 | 350001.3654 | −344999.2747 | −1365.364 | 725.301 |
| −190 | −345 | 190000.8406 | −344999.4893 | −840.585 | 510.69 |
| −350 | −441 | 350001.4408 | −440999.1964 | −1440.777 | 803.557 |
| −190 | −441 | 190001.2533 | −440999.2269 | −1253.305 | 773.061 |
| −10 | −441 | 10001.03528 | −440999.7855 | −1035.281 | 214.55 |
| 10 | −441 | −9998.98442 | −440999.8731 | −1015.58 | 126.859 |
| 190 | −249 | −189999.914 | −249000.9942 | −85.834 | −994.249 |
| 350 | −249 | −350000.274 | −249001.8047 | 274.015 | −1804.733 |
| 190 | −345 | −189999.523 | −345001.1385 | −476.832 | −1138.491 |
| 350 | −345 | −349999.849 | −345001.8919 | −151.204 | −1891.935 |

TABLE 1-continued

Data about positions and deviations of detection marks on the substrate

| Mark Position X(mm) | Mark Position Y(mm) | Result X(μm) | Result Y(μm) | delta X(μm) | delta Y(μm) |
|---|---|---|---|---|---|
| 190 | −441 | −189999.014 | −441001.0691 | −985.971 | −1069.105 |
| 350 | −441 | −349999.362 | −441001.9779 | −638.274 | −1977.879 |

The lengths of connecting lines between all detection mark points, deviations obtained after measurement, and corrected lengths of the connecting lines are output, to form Table 2 as follows:

TABLE 2

Data obtained before and after amendment to the connecting lines between the detection mark points

| Mark Distance# | Mark Distance (μm) | result(μm) | delta(μm) |
|---|---|---|---|
| L1 | 422000 | 422000.0464 | 0.0464 |
| L2 | 340000 | 340000.4755 | 0.4755 |
| L3 | 422000 | 421999.6828 | 0.3172 |
| L4 | 340000 | 340000.6742 | 0.6742 |
| L5 | 541926.1942 | 541926.3858 | 0.1916 |
| L6 | 541926.1942 | 541926.5131 | 0.3188 |
| L7 | 422000 | 421999.9282 | 0.0718 |
| L8 | 340000 | 340000.108 | 0.1080 |
| L9 | 422000 | 422000.4425 | 0.4425 |
| L10 | 340000 | 340000.5934 | 0.5934 |
| L11 | 541926.1942 | 541926.8832 | 0.6890 |
| L12 | 541926.1942 | 541926.2339 | 0.0397 |
| L13 | 422000 | 422000.1911 | 0.1911 |
| L14 | 340000 | 340000.7877 | 0.7877 |
| L15 | 422000 | 421999.8378 | 0.1622 |
| L16 | 340000 | 340000.4055 | 0.4055 |
| L17 | 541926.1942 | 541926.2679 | 0.0737 |
| L18 | 541926.1942 | 541926.8916 | 0.6974 |
| L19 | 422000 | 421999.9442 | 0.0558 |
| L20 | 340000 | 340000.5438 | 0.5438 |
| L21 | 422000 | 422000.3868 | 0.3868 |
| L22 | 340000 | 340000.3773 | 0.3773 |
| L23 | 541926.1942 | 541927.0428 | 0.8486 |
| L24 | 541926.1942 | 541926.1813 | 0.0129 |
| L25 | 882000 | 882000.2255 | 0.2255 |
| L26 | 700000 | 700000.5276 | 0.5276 |
| L27 | 882000 | 882001.0163 | 1.0163 |
| L28 | 700000 | 700000.8025 | 0.8025 |
| L29 | 1126021.314 | 1126022.449 | 1.1352 |
| L30 | 1126021.314 | 1126021.979 | 0.6644 |

Thus, the position of the substrate carrier and the position of the optical measurement unit are amended by using the foregoing steps. The amended data may be fed back to a lithography device. During alignment for photolithography, corresponding adjustment can be made according to the data.

The embodiments of the present invention have been described above, but the present invention is not limited to the embodiments. Apparently, persons skilled in the art can make various modifications and variations to the present invention without departing from the spirit and scope of the present invention. Thus, if such modifications and variations to the present invention fall within the scope of the appended claims and the equivalent technique, the present invention is also intended to include such modifications and variations.

What is claimed is:
1. An optical measurement device, comprising:
a substrate carrier, configured to carry a substrate;
an optical detection platform frame, configured to bear and support an optical detection slider above the substrate carrier, the optical detection slider being able to slide along the optical detection platform frame;
an optical detection unit, located above the substrate carrier and attached to the optical detection slider, and able to move along the optical detection platform frame with the optical detection slider, the optical detection unit comprising a sensor;
a substrate carrier position measurement module, configured to measure a position of the substrate carrier;
an optical detection unit position measurement module, configured to measure a position of the optical detection unit;
a processor, configured to obtain, based on the position of the substrate carrier and the position of the optical detection unit, deviations in measurement of mark positions induced by movements of the substrate carrier and the optical detection unit, and further configured to correct the mark positions measured by the sensor based on the deviations in measurement of the mark positions.

2. The optical measurement device of claim 1, wherein the substrate carrier position measurement module comprises a substrate carrier Y-direction measuring component and a substrate carrier X-direction measuring component; the substrate carrier Y-direction measuring component is configured to measure a displacement of the substrate carrier in a Y direction; and the substrate carrier X-direction measuring component is configured to measure an offset of the substrate carrier in an X direction during Y-direction movement of the substrate carrier.

3. The optical measurement device of claim 2, wherein the substrate carrier Y-direction measuring component and the substrate carrier X-direction measuring component are both interferometers.

4. The optical measurement device of claim 1, wherein the optical detection unit position measurement module comprises: an optical detection unit X-direction measuring component, an optical detection slider X-direction measuring component, and an optical detection unit Y-direction measuring component, wherein the optical detection unit X-direction measuring component is configured to measure a displacement of the optical detection unit in an X direction; the optical detection slider X-direction measuring component is configured to measure a displacement of the optical detection slider in the X direction; and the optical detection unit Y-direction measuring component is configured to measure an offset of the optical detection unit with respect to the optical detection platform frame in a Y direction during X-direction movement of the optical detection unit.

5. The optical measurement device of claim 4, wherein the optical detection unit X-direction measuring component and the optical detection slider X-direction measuring component are both interferometers, and the optical detection unit Y-direction measuring component is a laser displacement sensor.

6. The optical measurement device of claim 1, wherein the optical detection unit further comprises a height adjustment module for measuring and adjusting a distance from the optical detection unit to an upper surface of the substrate.

7. The optical measurement device of claim 1, wherein a reference board having calibration marks is further provided on the substrate carrier, and the reference board is configured to correct the position of the substrate carrier and the position of the optical detection unit.

8. The optical measurement device of claim 7, wherein the reference board having calibration marks comprises a horizontal reference board and a vertical reference board perpendicular to the horizontal reference board; the horizontal reference board is arranged along an X direction of the substrate carrier and is used for calibrating a positional deviation of the substrate from the optical detection unit in a Y direction which occurs when the optical detection unit moves along the X direction; and the vertical reference board is arranged along the Y direction of the substrate carrier and is used for calibrating a positional deviation of the substrate from the optical detection unit in the X direction which occurs when the substrate carrier moves along the Y direction.

9. The optical measurement device of claim 1, further comprising a support base for carrying the substrate carrier and the optical detection platform frame.

10. The optical measurement device of claim 1, wherein the support base comprises a vibration damper and a marble platform from bottom to top.

11. The optical measurement device of claim 1, wherein the optical detection unit is further used for detecting a line width of a pattern formed on the substrate after exposure, an overlay deviation, a mark position deviation, and/or a photoresist thickness.

12. A measurement method using the optical measurement device of claim 1, wherein a direction in which the optical detection slider moves along the optical detection platform frame is defined as an X direction, a direction perpendicular to the X direction in a horizontal plane is defined as a Y direction, and a vertical direction is defined as a Z direction, to establish a three-dimensional coordinate system in the X, Y, Z directions; and the method comprises the following steps:
providing the substrate having detection marks and placing the substrate on the substrate carrier;
controlling the substrate carrier to move along the Y direction, and controlling the optical detection unit to move along the X direction, such that a detection mark (i) is located below the sensor, wherein the mark position measurement module measures an alignment deviation (dxi_align, dyi_align) of the detection mark (i) from a center of the sensor;
measuring, by a substrate carrier Y-direction measuring component, a displacement Yi of the substrate carrier in the Y direction, a magnitude Rzy_wsi of rotation of the substrate carrier in a ZY plane, and an inclination Rx_wsi of the substrate about an X axis; and measuring, by a substrate carrier X-direction measuring component, an offset X_wsi of the substrate carrier in the X direction when the substrate carrier moves to a position Yi; and then calculating an alignment deviation (dxi_align1, dyi_align1) of the detection mark (i) from the center of the sensor, which alignment deviation (dxi_align1, dyi_align1) is induced when the substrate carrier moves to the position Yi, according to the offset X_wsi of the substrate carrier in the X direction when the substrate carrier moves to the position Yi, the magnitude Rzy_wsi of rotation of the substrate carrier in the ZY plane, and the inclination Rx_wsi of the substrate about the X axis;
measuring, by an optical detection unit X-direction measuring component, a displacement Xi of the optical detection unit in the X direction; measuring, by an optical detection slider X-direction measuring component, a displacement X'i of the optical detection slider in the X direction and a magnitude Rzx_omi of rotation of the optical detection slider in a ZX plane; measuring, by an optical detection unit Y-direction measuring component, an offset Y_omi of the optical detection unit with respect to the optical detection platform frame in the Y direction when the optical detection unit moves to a position Xi, and an inclination Rx_omi of the optical detection unit about the X axis; calculating an inclination Ry_omi of the optical detection unit about a Y axis when the optical detection unit moves to the position Xi according to the displacement Xi of the optical detection unit in the X direction and the displacement X'i of the optical detection slider in the X direction; and afterwards, calculating an alignment deviation (dxi_align2, dyi_align2) of the detection mark (i) from the center of the sensor, which alignment deviation (dxi_align2, dyi_align2) is induced when the optical detection unit moves to the position Xi, according to a magnitude Rzx_omi of rotation of the optical detection unit in the ZX plane when the optical detection unit moves to the position Xi and the inclination Ry_omi about the Y axis, and the offset Y_omi of the optical detection unit with respect to the optical detection platform frame in the Y direction and the inclination Rx_omi about the X axis; and
correcting the alignment deviation (dxi_align, dyi_align) of the detection mark (i) from the center of the sensor according to the alignment deviation (dxi_align1, dyi_align1) of the detection mark (i) from the center of the sensor which is induced when the substrate carrier moves to the position Yi and the alignment deviation (dxi_align2, dyi_align2) of the detection mark (i) from the sensor which is induced when the optical detection unit moves to the position Xi;
wherein each of the dxi_align, dxi_align1 and dxi_align2 corresponds to an alignment in the X direction, and each of the dyi_align, dyi_align1 and dyi_align2 corresponds to an alignment in the Y direction.

13. The optical measurement method of claim 12, wherein the alignment deviation (dxi_align1, dyi_align1) of the detection mark (i) from the center of the sensor which is induced when the substrate carrier moves to the position Yi is calculated according to the following formula:

$$dxi\_align1 = X\_wsi + A\_ws \times Rzy\_wsi;$$

$$dyi\_align1 = B\_ws \times Rzy\_wsi + H\_ws \times Rx\_wsi;$$

wherein A_ws is a deviation of a center of a measurement spot from a rotation center of the substrate carrier in the Y direction, the measurement spot being projected by the substrate carrier X-direction measuring component onto the substrate carrier;
B_ws is a deviation of a center of a measurement spot from the rotation center of the substrate carrier in the X direction, the measurement spot being projected by the substrate carrier Y-direction measuring component onto the substrate carrier; and H_ws is a distance from a center of the measurement spot to an optimal focal plane of the sensor in the Z direction, the measurement spot being projected by the substrate carrier Y-direction measuring component onto the substrate carrier.

14. The optical measurement method of claim 13, wherein the alignment deviation (dxi_align2, dyi_align2) of the detection mark (i) from the center of the sensor which is induced when the optical detection unit moves to the position Xi is calculated according to the following formula:

$$dxi\_align2 = A\_om \times Rzx\_omi + H\_om \times Ry\_omi;$$

$$dyi\_align2 = Y\_omi + B\_om \times Rzx\_omi + H'\_om \times Rx\_omi,$$

wherein A_om is a deviation of a center of a measurement spot from a rotation center of the optical detection unit in the Y direction, the measurement spot being projected by the optical detection unit X-direction measuring component onto the optical detection unit;

B_om is a deviation of a center of a measurement spot from the rotation center of the optical detection unit in the X direction, the measurement spot being projected by the optical detection unit Y-direction measuring component onto the optical detection unit;

H_om is a distance from the center of the measurement spot to the optimal focal plane of the sensor in the Z direction, the measurement spot being projected by the optical detection unit X-direction measuring component onto the optical detection unit; and H'_om is a distance from a center of a measurement spot to the optimal focal plane of sensor in the Z direction, the measurement spot being projected by the optical detection slider X-direction measuring component onto the optical detection slider.

15. The optical measurement method of claim 12, further comprising calibrating a position of the substrate carrier and a position of the optical detection unit, which specifically comprises the following steps:

measuring calibration marks on a reference board on the substrate carrier, by: controlling the substrate carrier to move along the Y direction and the optical detection unit to move along the X direction, such that a calibration mark (j) on the reference board is located below the sensor; measuring, by the sensor, a position of the calibration mark j; and calculating an alignment deviation (dxj_align, dyj_align) of the calibration mark j from the center of the sensor;

measuring, by the substrate carrier Y-direction measuring component, a displacement Yj of the substrate carrier in the Y direction, a magnitude Rzy_wsj of rotation of the substrate carrier in the ZY plane, and an inclination Rx_wsj of the substrate carrier about the X axis; measuring, by the substrate carrier X-direction measuring component, an offset X_wsj of the substrate carrier in the X direction when the substrate carrier moves to a position Yj; and then, calculating an alignment deviation (dxj_align1, dyj_align1) of the calibration mark j from the center of the sensor, which alignment deviation (dxj_align1, dyj_align1) is induced when the substrate carrier moves to the position Yj, according to the offset X_wsj of the substrate carrier in the X direction when the substrate carrier moves to the position Yj, the magnitude Rzy_wsj of rotation of the substrate carrier in the ZY plane, and the inclination Rx_wsj of the substrate carrier about the X axis;

measuring, by the optical detection unit X-direction measuring component, a displacement Xj of the optical detection unit in the X direction; measuring, by the optical detection slider X-direction measuring component, a displacement X'j of the optical detection slider in the X direction and a magnitude Rzx_omj of rotation of the optical detection slider in the ZX plane; measuring, by the optical detection unit Y-direction measuring component, an offset Y_omj of the optical detection unit with respect to the optical detection platform frame in the Y direction when the optical detection unit moves to the position Xj, and an inclination Rx_omj of the optical detection unit about the X axis; calculating an inclination Ry_omj of the optical detection unit about the Y axis when the optical detection unit moves to the position Xj according to the displacement Xj of the optical detection unit in the X direction and the displacement X'j of the optical detection slider in the X direction; and afterwards, calculating an alignment deviation (dxj_align2, dyj_align2) of the calibration mark j from the center of the sensor, which alignment deviation (dxj_align2, dyj_align2) is induced when the optical detection unit moves to the position Xj, according to the magnitude Rzx_omj of rotation of the optical detection unit in the ZX plane and the inclination Ry_omj about the Y axis when the optical detection unit moves to the position Xj, and the offset Y_omj of the optical detection unit with respect to the optical detection platform frame in the Y direction and the inclination Rx_omj about the X axis;

correcting the alignment deviation (dxj_align, dyj_align) of the calibration mark (j) from the center of the sensor according to the alignment deviation (dxj_align1, dyj_align1) of the calibration mark j from the center of the sensor which is induced when the substrate carrier moves to the position Yj and the alignment deviation (dxj_align2, dyj_align2) of the calibration mark j from the center of sensor which is induced when the optical detection unit moves to the position Xj;

repeating the foregoing steps, to obtain corrected alignment deviations (dxj_align, dyj_align) of all the calibration marks from the center of the sensor, wherein j=1, 2, . . . n;

processing the corrected alignment deviations (dxj_align, dyj_align), j=1, 2, . . . n, of all the calibration marks from the center of the sensor, to obtain an alignment residual ΔXi between the reference board and the center of the sensor when the substrate carrier is at the position Yi and an alignment residual ΔYi between the reference board and the center of the sensor when the optical detection unit is at the position Xi; and finally, compensating the alignment deviation (dxi_align1, dyi_align1) of the detection mark (i) from the center of the sensor which is induced when the substrate carrier moves to the position Yi, with the alignment residual ΔXi between the reference board and the center of the sensor when the substrate carrier is at the position Yi; and compensating the alignment deviation (dxi_align2, dyi_align2) of the detection mark (i) from the center of the sensor which is induced when the optical detection unit moves to the position Xi, with the alignment residual ΔYi between the reference board and the center of the sensor when the optical detection unit is at the position Xi.

16. The optical measurement method of claim 15, wherein the alignment deviation (dxi_align1, dyi_align1) of the detection mark (i) from the center of the sensor which is induced when the substrate carrier moves to the position Yi is compensated with the alignment residual ΔXi between the reference board and the center of the sensor when the substrate carrier is at the position Yi, according to the following formula:

$$dxi\_align1 = X\_wsi + A\_ws \times Rzy\_wsi + \Delta Xi;$$

$$dyi\_align1 = B\_ws \times Rzy\_wsi + H\_ws \times Rx\_wsi,$$

wherein A_ws is a deviation of a center of a measurement spot from a rotation center of the substrate carrier in the Y direction, the measurement spot being projected by the substrate carrier X-direction measuring component onto the substrate carrier;

B_ws is a deviation of a center of a measurement spot from the rotation center of the substrate carrier in the X direction, the measurement spot being projected by the substrate carrier Y-direction measuring component onto the substrate carrier; and H_ws is a distance from the center of the measurement spot to an optimal focal plane of the sensor in the Z direction, the measurement spot being projected by the substrate carrier Y-direction measuring component onto the substrate carrier.

17. The optical measurement method of claim 15, wherein the alignment deviation (dxi_align2, dyi_align2) of the detection mark (i) from the center of the sensor which is induced when the optical detection unit moves to the position Xi is compensated with the alignment residual ΔYi between the reference board and the center of the sensor when the optical detection unit is at the position Xi, according to the following formula:

$$dxi\_align2 = A\_om \times Rzx\_omi + H\_om \times Ry\_omi;$$

$$dyi\_align2 = Y\_omi + B\_om \times Rzx\_omi + H'\_om \times Rx\_omi + \Delta Yi,$$

wherein A_om is a deviation of a center of a measurement spot from a rotation center of the optical detection unit in the Y direction, the measurement spot being projected by the optical detection unit X-direction measuring component onto the optical detection unit;

B_om is a deviation of a center of a measurement spot from the rotation center of the optical detection unit in the X direction, the measurement spot being projected by the optical detection unit Y-direction measuring component onto the optical detection unit;

H_om is a distance from the center of the measurement spot to the optimal focal plane of the sensor in the Z direction, the measurement spot being projected by the optical detection unit X-direction measuring component onto the optical detection unit; and H'_om is a distance from a center of a measurement spot to the optimal focal plane of the sensor in the Z direction, the measurement spot being projected by the optical detection slider X-direction measuring component onto the optical detection slider.

18. The optical measurement method of claim 15, wherein a Y-direction reference board parallel with the Y direction is arranged on the substrate carrier, and is used for measuring an alignment residual ΔXi between the Y-direction reference board and the center of the sensor when the substrate carrier is at the position Yi; and an X-direction reference board parallel with the X direction is arranged on the substrate carrier, and is used for measuring an alignment residual ΔYi between the X-direction reference board and the center of the sensor when the optical detection unit is at the position Xi.

19. The optical measurement method of claim 15, wherein the corrected alignment deviations (dxj_align, dyj_align) of all the reference marks from the center of the sensor are processed by using a linear interpolation method, wherein j=1, 2, . . . n, to obtain the alignment residual ΔXi between the reference board and the center of the sensor when the substrate carrier is at the position Yi and the alignment residual ΔYi between the reference board and the center of the sensor when the optical detection unit is at the position Xi.

20. The optical measurement method of claim 12, wherein detecting a detection mark by the sensor further comprises:
measuring a current height value Z1 from the sensor to the detection mark;
calculating a height difference dZ, between the height value Z1 and a height value Z2 of an optimal focal plane of the sensor as dZ=Z1−Z2; and
controlling the sensor to vertically move by a distance of dZ, such that the detection mark is located on the optimal focal plane of the sensor.

* * * * *